United States Patent [19]

Joo

[11] Patent Number: 5,619,469
[45] Date of Patent: Apr. 8, 1997

[54] FUSE REDUNDANCY CIRCUITRY FOR A SEMICONDUCTOR MEMORY DEVICE

[75] Inventor: Yang-Sung Joo, Seoul, Rep. of Korea

[73] Assignee: LG Semicon Co., Ltd., Chungcheongbuk-do, Rep. of Korea

[21] Appl. No.: 569,795

[22] Filed: Dec. 6, 1995

[30] Foreign Application Priority Data

May 26, 1995 [KR] Rep. of Korea .................. 95-13405

[51] Int. Cl.⁶ .................................................. G11C 7/00
[52] U.S. Cl. ............... 365/225.7; 365/226; 365/230.08; 365/200
[58] Field of Search .................. 365/226, 230.08, 365/225.7, 200

[56] References Cited

U.S. PATENT DOCUMENTS 4,571,707  2/1986  Watanabe ..................... 365/200
5,300,840  4/1994  Drouot ........................... 327/51

Primary Examiner—Viet Q. Nguyen
Assistant Examiner—Andrew Q. Tran
Attorney, Agent, or Firm—Morgan, Lewis and Bockius LLP

[57] ABSTRACT

A programming section of a semiconductor memory device includes an external power source detecting circuit adapted for detecting an initial power supply and for generating a power-up signal, a gate control section for receiving the power-up signal from the external power source detecting circuit and for generating a first signal and a second signal, a programmable ROM cell for receiving the first and second signals from the gate control section and for generating an output, and a latch section for latching the output of the programmable ROM cell.

20 Claims, 2 Drawing Sheets

FUSE REDUNDANCY CIRCUITRY FOR A SEMICONDUCTOR MEMORY DEVICE

BACKGROUND OF THE INVENTION

1. Field of the Invention

The present invention relates to a semiconductor memory device, and more particularly, to a programming section of a semiconductor memory device having a fuse read only memory (fuse ROM).

2. Discussion of the Related Art

FIG. 1 illustrates a fuse ROM for a conventional semiconductor memory device. A fuse FUSE1 is composed of a resistive component which can be opened in a wafer state with a laser cutting machine. An inverting device INV1 and a transistor M1 are connected to the fuse FUSE1 for latching the state of a contact node N1 of the fuse FUSE1.

The operation of the above conventional fuse ROM will now be described. If the fuse FUSE1 is connected, the node N1 has a high level, and the output OUT becomes a zero state. On the other hand, if the fuse FUSE1 is opened, the node N1 is discharged to a low level through the transistor M1 driving the output OUT to a '1' state. That is, the output depends on the connection or disconnection of the fuse. If the fuse is cut off, the output terminal produces '1'. If the fuse is not cut off, an output '0' is produced.

However, in this conventional fuse ROM, if power is supplied to the chip, the fuse FUSE1 latches, and, at the instant when the power is supplied, a considerably large current I1 flows through the fuse FUSE1 and the transistor M1 when the state of the chip is unstable, resulting in a prolonged continuation of the unstable state. Particularly, a large capacity memory device is provided with a considerably large number of fuse ROMs for redundant memory blocks. Therefore, the sum of the unstable currents I1 totals several tens of mA. Furthermore, if the fuse FUSE1 is cut by a laser cutting machine and the fuse FUSE1 is not completely opened and remains in a connected state, a leakage current continuously flows to the node N1. As a result, such leakage current represents a considerable portion of the total leakage current. In such a case, the following problems occur. The output OUT does not represent an open state of the fuse FUSE1, but is latched to a value corresponding to a connected state of the fuse. Furthermore, the power consumption of the memory device at the standby state is increased, and therefore, the memory device becomes unsuitable for low power applications.

SUMMARY OF THE INVENTION

Accordingly, the present invention is directed to a semiconductor memory device that substantially eliminates one or more of the problems due to limitations and disadvantages of the related art.

Another object of the present invention is to provide a semiconductor memory device for preventing erroneous latching of a fuse state without increasing power consumption.

Additional features and advantages of the invention will be set forth in the description which follows, and in part will be apparent from the description, or may be learned by practice of the invention. The objectives and other advantages of the invention may be realized and obtained by the device particularly pointed out in the written description and claims hereof as well as the appended drawings.

To achieve these and other advantages and in accordance with the purpose of the invention, as embodied and broadly described herein, a programming section of a semiconductor memory device includes an external power source detecting circuit adapted for detecting an initial power supply and for generating a power-up signal, a gate control section for receiving the power-up signal from the external power source detecting circuit and for generating a first signal and a second signal, a programmable ROM cell for receiving the first and second signals from the gate control section and for generating an output, and a latch section for latching the output of the programmable ROM cell.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the invention and are incorporated in and constitute a part of this specification, illustrate embodiments of the invention and, together with the description, serve to explain the principles of the invention.

In the drawings.

DESCRIPTION OF THE PREFERRED EMBODIMENT

Preferred embodiments of a semiconductor memory device having a programming section using a fuse according to the present invention will now be described with reference to the accompanying drawings.

Figure 1:
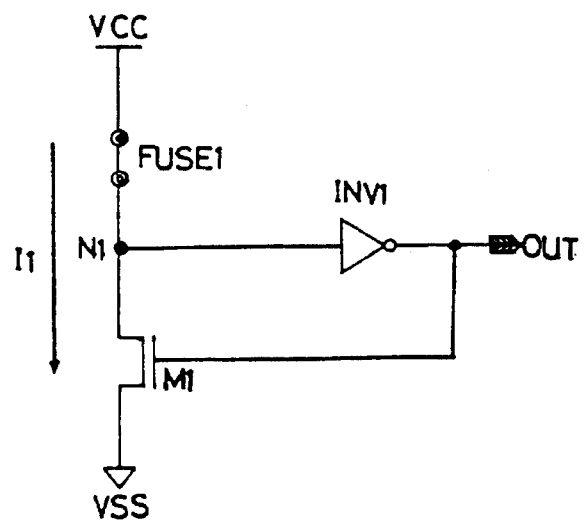
FIG. 1 is a schematic diagram of a circuit of a conventional semiconductor memory device having a fuse ROM.
Figure 2:
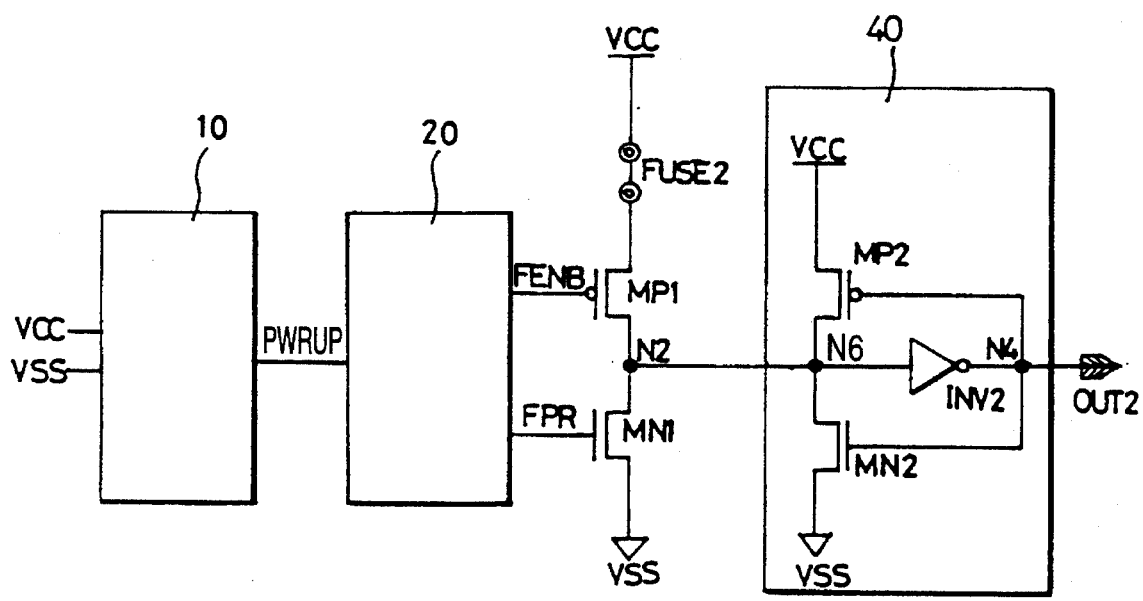
FIG. 2 is a schematic diagram of the circuit of a semiconductor memory device having a fuse ROM according to an embodiment of the present invention.

FIG. 2 illustrates a circuit of a semiconductor memory device having a fuse ROM in accordance with the present invention. A fuse FUSE2, a PMOS transistor MP1, and an NMOS transistor MN1 are connected in series between a power source $V_{cc}$ and a ground voltage $V_{ss}$. The relative position of the fuse and the MOS transistors can be changed. The gates of the MOS transistors are connected to a gate control section 20 which controls the fuse in response to signals from an external power supply detecting circuit 10. Circuit 10 is connected to the power supply voltage $V_{cc}$ and ground voltage $V_{ss}$. The gate control section 20 supplies a fuse enable bar signal FENB to the gate of the PMOS transistor MP1, and supplies a fuse pre-discharge signal FPR to the NMOS transistor MN1.

FIG. 2 also shows a latching section 40 which is designed as follows. Two MOS transistors MP2 and MN2 of different conductivity types are connected in series between the power source voltage $V_{cc}$ and the ground voltage $V_{ss}$. A node N2 is connected to a connection point N6 between the MOS transistors MP2 and MN2, and an inverting device INV2 is connected between connection point N6 and output node N4. The gates of the MOS transistors MP2 and MN2 are connected to the output node N4. An output OUT2 of the inverting device INV2 is supplied from the output node N4 to the gates of the PMOS transistor MP2 and the NMOS transistor MN2, thereby controlling the gates of the transistors. Therefore, in accordance with the gate control signals, one of the MOS transistors MP2 and MN2 is turned on. Thus, the node N2 is latched to a same state, as long as the state of the fuse is not changed.

Figure 3:
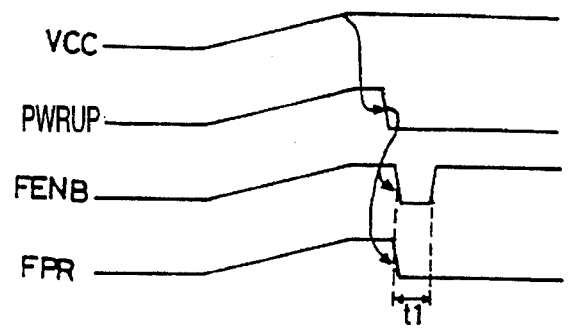
FIG. 3 is a timing chart showing the wave patterns of respective signals for explaining the operation of the circuit of FIG. 2.

FIG. 3 is a timing chart showing wave patterns of the respective signals in the circuit of FIG. 2. The operation of the circuit of the present invention will be described with reference to the wave patterns of FIG. 3. When power is supplied to the circuit, the power source voltage is gradually stepped up until the level $V_{cc}$ is reached. Then, the latching section 40 latches the state of the fuse within a short period of time t1, and outputs the same state through the output node.

That is, if the power is supplied to the chip, the external power source detecting circuit 10 is activated, and then, a power supply signal PWRUP, which indicates the power supply time, is enabled. In order to prevent the operation of the internal circuit before the internal power state is stabilized, the circuit 10 blocks the inputting of the external power. When the internal power is stabilized, the signal PWRUP is disabled. Then, the gate control section 20 disables the fuse pre-discharge signal FPR, and generates the fuse enable bar signal FENB as a low active short pulse.

Accordingly, the fuse pre-discharge signal FPR is immediately disabled, and the NMOS transistor MN1, which has been pre-discharging the first node N2 to the ground level $V_{ss}$, is turned off, while the fuse enable bar signal FENB turns on the PMOS transistor MP1 during the short pulse. Consequently, in accordance with the state of the fuse FUSE2, either the level of the first node N2 is maintained at the ground voltage $V_{ss}$ (if the fuse FUSE2 is open), or the level of the first node N2 is pulled up to the power supply voltage $V_{cc}$ (if the fuse FUSE2 is connected).

The latching section 40, which includes the NMOS transistor MN2, the PMOS transistor MP2, and the inverting device INV2, initially maintains the level of the first node N2 at the ground level $V_{ss}$. When the fuse FUSE2, which is a part of the programmable ROM cell, is connected, the latching section 40 pulls up the level of the node N2 to the power supply level $V_{cc}$. That is, the latching section 40 which includes the NMOS transistor MN2, the PMOS transistor MP2 and the inverting device INV2 initially maintains the level of the first node N2 at a zero level and therefore, the output is maintained at a high level. When the fuse FUSE2 is connected, a large current which exceeds the current sink capacity of the NMOS transistor MN2 flows through the PMOS transistor MP1 during the low active period of the signal FENB, with the result that the state of the first node N2 shifts to a high level. Consequently, the output OUT shifts to a low level. Meanwhile, even when the short pulse of the fuse enable bar signal FENB is terminated, the input of the inverting device INV2 is maintained at a high level by the PMOS transistor MP2 of the latching section 40, which has been turned on by the low output On the other hand, when the fuse FUSE2 is open, even if the PMOS transistor MP1 is turned on, the first node N2 shifts to a ground level $V_{ss}$ (low level) due to a lack of a current source path and by the NMOS transistor MN1 which has been turned on by the fuse pre-discharge signal FPR.

Consequently, the output OUT2 becomes a high state. The high output turns on the NMOS transistor MN2 of the latching section 40, so that the input to the inverting device INV2 is maintained at a low level.

Figure 4:
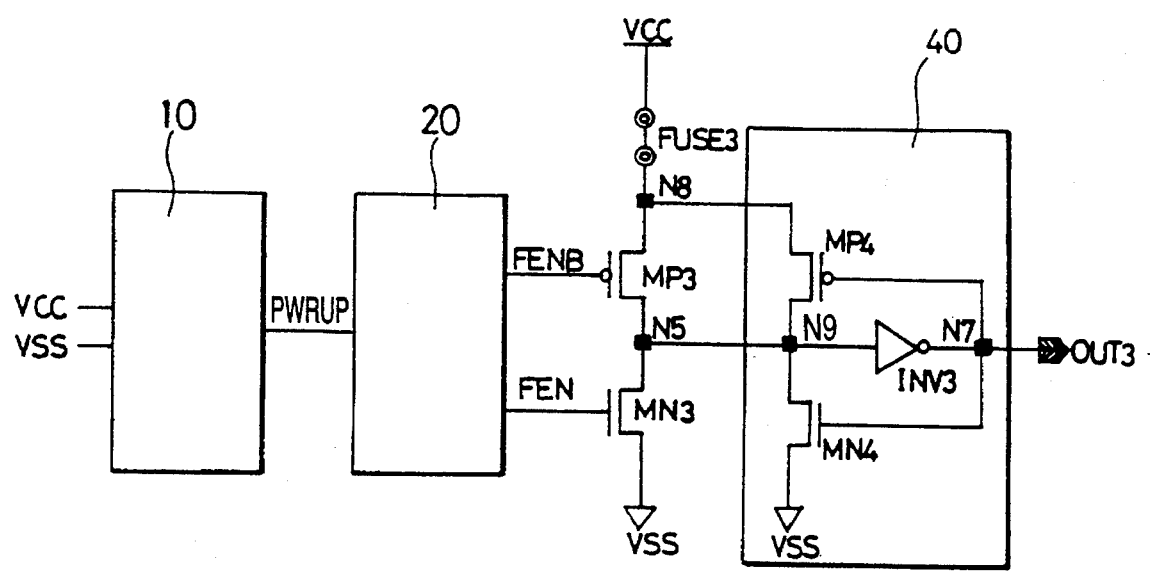
FIG. 4 is a schematic diagram of a circuit of the semiconductor memory device having a fuse ROM according to another embodiment of the present invention.

FIG. 4 illustrates a circuit of another embodiment of the present invention. The circuit of the second embodiment is similar to the circuit of FIG. 2 in that it includes an external power supply detecting circuit 10, a gate control section 20, a programmable ROM cell and a latching section 40. However, in the second embodiment, the source of a PMOS transistor MP4 of the latching section 40 is connected to a node N8 between a fuse FUSE3 of the programmable ROM cell and the PMOS transistor MP3, thereby supplying the power source Vcc. Furthermore, the gate control section 20 supplies a fuse enable signal FEN and a fuse enable bar signal FENB to the MOS transistors of the programmable ROM cell.

In this case if the fuse FUSE3 is connected the power $V_{cc}$ is continuously supplied through the fuse FUSE3 to the PMOS transistor MP4. On the other hand, if the fuse FUSE3 is open, the PMOS transistor MP4 is turned off. Therefore, it operates in a similar manner as that of FIG. 2.

Figure 5:
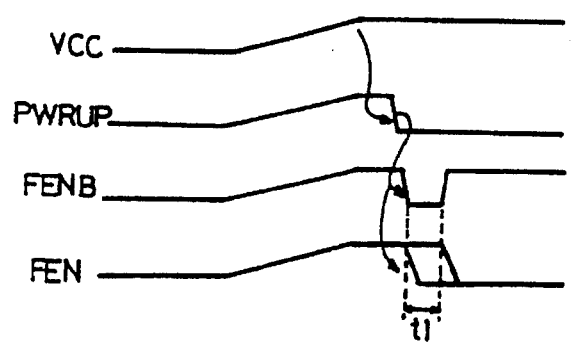
FIG. 5 is a timing chart showing the wave patterns of respective signals for explaining the operation of the circuit of FIG. 4.

FIG. 5 is a timing chart showing wave patterns for the circuit of FIG. 4. The operation in this case is basically similar to that of FIG. 3, except in the following details. During time t1 in which the fuse enable bar signal FENB is supplied in the form of a short pulse, and when the fuse enable signal FEN which is supplied to the gate of the NMOS transistor MN3 (and which functions similar to the fuse pre-discharge signal), is disabled, an extra timing margin is provided.

According to the present invention as described above, even if the fuse is not completely disconnected leaving a finite resistance, a current path is not formed to the ground after the completion of the sampling, thereby not generating leakage current. Furthermore, the sampling of the fuse state is carried out after stabilization of all the internal power, and therefore, an unstable state can adversely affect the initialization to the minimum degree. Furthermore, the sampling is executed in the initial period, thereby minimizing power loss. Consequently, the circuit of the present invention can be applied to low power applications.

It will be apparent to those skilled in the art that various modifications and variations can be made in the programming section of semiconductor memory device of the present invention without departing from the spirit or scope of the invention. Thus, it is intended that the present invention cover the modifications and variations of this invention provided they come within the scope of the appended claims and their equivalents.

What is claimed is:

1. A programming section of a semiconductor memory device, comprising:

an external power source detecting circuit detecting an initial power supply and generating a power-up signal;

a gate control section receiving the power-up signal from the external power source detecting circuit and generating a first signal and a second signal;

a programmable ROM cell receiving the first and second signals from the gate control section and generating an output; and a latch section latching the output of the programmable ROM cell.

2. The programming section of a semiconductor memory device according to claim 1, wherein the programmable ROM cell includes a fuse, and first and second MOS transistors, the first and second MOS transistors adapted to receive the first and second signals from the gate control section, respectively.

3. The programming section of a semiconductor memory device according to claim 1, wherein the programmable ROM cell comprises:
   a fuse;
   a first transistor for receiving an external power through the fuse, the first signal of the gate control section being supplied to a gate of the first transistor;
   a second transistor connected in series with the first transistor, the second signal of the gate control section being supplied to a gate of the second transistor; and
   a contact node located between the first transistor and the second transistor, for outputting the output of the programmable ROM cell.

4. The programming section of a semiconductor memory device according to claim 3, wherein the fuse is in a cut off state during programming.

5. The programming section of a semiconductor memory device according to claim 3, wherein the second transistor pre-discharges the contact node.

6. The programming section of a semiconductor memory device according to claim 3, wherein the first signal is a fuse enable bar signal and the second signal is a fuse pre-discharge signal.

7. The programming section of a semiconductor memory device according to claim 3, wherein the first transistor is of a first conductivity type and the second transistor is of a second conductivity type.

8. The programming section of a semiconductor memory device according to claim 7, wherein the first transistor is a PMOS transistor and the second transistor is an NMOS transistor.

9. The programming section of a semiconductor memory device according to claim 1, wherein the latch section includes:
   a first transistor connected to a power source voltage;
   a second transistor connected between the first transistor and a reference voltage;
   a connection node for connecting the first transistor, the second transistor, and the output of the programmable ROM cell;
   an inverting device for receiving a signal from the connection node; and
   an output node connected to an output of the inverting device and to respective gates of the first and second transistors.

10. The programming section of a semiconductor memory device of claim 9, wherein the reference voltage is ground voltage.

11. The programming section of a semiconductor memory device of claim 9, wherein the first transistor is of a first conductivity type and the second transistor is of a second conductivity type.

12. The programming section of a semiconductor memory device according to claim 11, wherein the first transistor is a PMOS transistor, and the second transistor is an NMOS transistor.

13. The programming section of a semiconductor memory device of claim 3, wherein the ROM cell further comprises a second node between the fuse and the first transistor and wherein the latch section includes:
   a third transistor connected to the second node of the ROM cell;
   a fourth transistor connected between the third transistor and a reference voltage;
   a connection node for connecting the third transistor, the fourth transistor, and the output of the programmable ROM cell;
   an inverting device for receiving a signal from the connection node; and
   an output node connected to an output of the inverting device and to respective gates of the third and fourth transistors.

14. The programming section of a semiconductor memory device according to claim 13, wherein the reference voltage is ground voltage.

15. The programming section of a semiconductor memory device according to claim 13, wherein the third transistor is of a first conductivity type and the fourth transistor is of a second conductivity type.

16. The programming section of a semiconductor memory device according to claim 15, wherein the third transistor is a PMOS transistor and the fourth transistor is an NMOS transistor.

17. A programming section of a semiconductor memory device, comprising:
   an external power source detecting circuit detecting an initial power supply and generating a power-up signal;
   a gate control section receiving the power-up signal from the external power source detecting circuit and generating a first signal and a second signal;
   a programmable ROM cell receiving the first and second signals from the gate control section and generating an output, the programmable ROM cell comprising:
      a fuse,
      a first transistor for receiving an external power through the fuse, the first signal of the gate control section being supplied to a gate of the first transistor,
      a second transistor connected in series with the first transistor, the second transistor having a gate for receiving the second signal of the gate control section, and
      a contact node located between the first transistor and the second transistor, for outputting the output of the programmable ROM cell; and
   a latch section latching the output of the programmable ROM cell, the latch section including:
      a third transistor receiving a power source voltages,
      a fourth transistor connected between the third transistor and a reference voltage,
      a connection node for connecting the third transistor, the fourth transistor, and the output of the programmable ROM cell,
      an inverting device for receiving a signal from the connection node, and
      an output node connected to an output of the inverting device and to respective gates of the third and fourth transistors.

18. The programming section of a semiconductor memory device according to claim 17, wherein the second transistor pre-discharges the contact node.

19. The programming section of a semiconductor memory device according to claim 17, wherein the programmable ROM cell further comprises a second node between the fuse and the first transistor and wherein the third transistor receives the power source voltage from the second node.

20. The programming section of a semiconductor memory device of claim 17, wherein the first and third transistors are PMOS transistors, and the second and fourth transistors are NMOS transistors.

* * * * *